United States Patent [19]
Yahata et al.

[11] Patent Number: 6,137,136
[45] Date of Patent: Oct. 24, 2000

[54] POWER SEMICONDUCTOR DEVICE

[75] Inventors: Akihiro Yahata, Yokohama; Satoshi Urano; Tomoki Inoue, both of Tokyo, all of Japan; Ichiro Omura, Zurich, Switzerland

[73] Assignee: Kabushiki Kaisha Toshiba, Kawasaki, Japan

[21] Appl. No.: 08/932,464

[22] Filed: Sep. 18, 1997

[30] Foreign Application Priority Data

Sep. 18, 1996 [JP] Japan ................................. 8-246303
Sep. 17, 1997 [JP] Japan ................................. 9-251812

[51] Int. Cl.[7] .................................................. H01L 29/76
[52] U.S. Cl. ........................................ 257/331; 257/330
[58] Field of Search .................................. 438/270–274; 257/139–145, 328, 329, 330, 331, 342, 401

[56] References Cited

U.S. PATENT DOCUMENTS

| | | | |
|---|---|---|---|
| 4,994,871 | 2/1991 | Chang et al. ............................ | 357/23.4 |
| 5,391,898 | 2/1995 | Hagino ..................................... | 257/142 |
| 5,656,517 | 8/1997 | Efland et al. ............................ | 438/273 |
| 5,733,810 | 3/1998 | Baba et al. .............................. | 438/268 |
| 5,780,324 | 7/1998 | Tokura et al. ........................... | 438/138 |
| 5,796,125 | 8/1998 | Matsudai et al. ....................... | 257/141 |
| 5,874,751 | 2/1999 | Iwamuro et al. ....................... | 257/139 |
| 5,895,952 | 4/1999 | Darwish et al. ........................ | 257/330 |

OTHER PUBLICATIONS

Mitsuhiko Kitagawa, et al., "A 4500 V Injection Enhanced Insulated Gate Bipolar Transistor (IEGT) Operating in a Mode Similar to a Thyristor", IEDM Technical Digest, (1993), pp. 679–682.

*Primary Examiner*—Tom Thomas
*Assistant Examiner*—Ori Nadav
*Attorney, Agent, or Firm*—Oblon, Spivak, McClelland, Maier & Neustadt, P.C.

[57] ABSTRACT

An injection enhanced insulated gate bipolar transistor is disclosed in which an average roughness of silicon on the side and bottom surfaces of trench grooves below a gate oxide film is made to be 0.6 nm or smaller. Irregular portions on the surface of silicon of the gate oxide film can be prevented. Thus, lowering of the gate breakdown voltage occurring because of dispersion of the thickness of the gate oxide film due to the irregular portions can be prevented.

11 Claims, 12 Drawing Sheets

POWER SEMICONDUCTOR DEVICE

BACKGROUND OF THE INVENTION

The present invention relates to a power semi-conductor device, and more particularly to an injection enhanced insulated gate bipolar transistor (hereinafter called as a "IEGT").

This application is based on Japanese Patent Application No.08-246303, filed Sep. 18, 1996, the content of which is incorporated herein by reference.

A power semiconductor device of a voltage operation type using an insulated gate, such as an EST (Emitter Switched Thyristor) or MCT (MOS Controlled Thyristor), is able to simplify a driver circuit thereof as compared with a current operation type power semiconductor device, such as a GTO (Gate Turn-off Thyristor).

However, the power semiconductor device having the insulated gate of the above-mentioned type has a problem in that the on-state voltage is excessively high. To solve the above-mentioned problem, it is suggested that a buried insulated gate is used.

Figure 1:
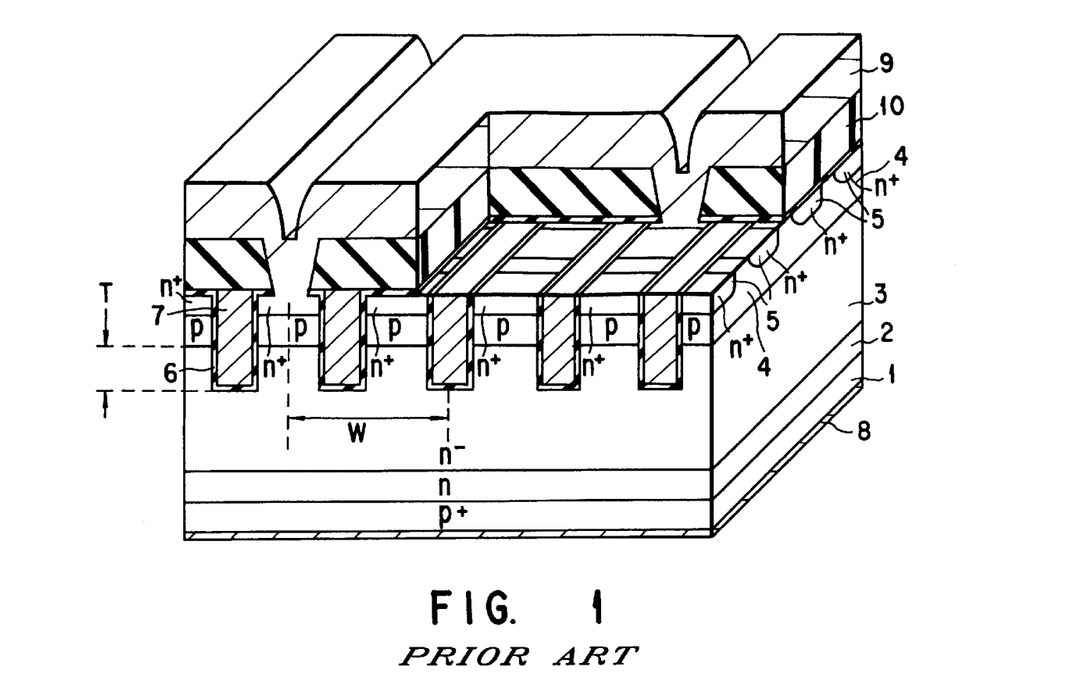
FIG. 1 is a perspective cross sectional view showing a conventional injection enhanced insulated gate bipolar transistor.

FIG. 1 is a perspective cross sectional view showing a conventional power semiconductor device using the buried insulated gate.

An n type buffer layer 2, a high impedance $n^-$ type base layer 3 and a p type base layer 4 are sequentially stacked on a high concentration $p^+$ type emitter layer 1.

A high concentration $n^+$ type emitter layer 5 is partially formed in the surface region of the p type base layer 4. A plurality of elongated emitter layers 5 extending in one direction (the lateral direction in FIG. 1) are formed. A plurality of trench grooves extending from the $n^+$ type emitter layer 5 to reach the $n^-$ type base layer 3 through the p type base layer 4 are formed in the surface region of the device on which the $n^+$ type emitter 5 is formed. The trench grooves are provided being perpendicular to the elongated emitter layers 5 so that trench grooves are extending in the longitudinal direction. A gate electrode 7 is buried in the trench groove through a gate oxide film 6. A cathode electrode 9 is formed on the surfaces of the p type base layer 4 and the $n^+$ type emitter layer 5 through an insulation film 10. The cathode electrode 9 is connected to the $n^+$ type emitter layer 5 and the p type base layer 4 through a through hole formed in the insulation film 10. An anode electrode 8 is formed on the overall surface of the $p^+$ type emitter layer 1 opposite to the n type buffer layer 2.

The depth, width and the intervals of the trench grooves in which the gate electrodes 7 are buried are designed optimally in such a manner that a low on-state voltage equivalent to that of the thyristor can be obtained though the device does not perform the thyristor operation. The optimum design is a design with which the efficiency to inject electrons from the $n^+$ type emitter layer 5 to the $n^-$ type base layer 3 can be raised and the voltage drop in the MOS portion can be lowered. As a result, the density of carriers accumulated in the $n^-$ type base layer 3 adjacent to the $n^+$ type emitter layer 5 can be raised so that the low on-state voltage is realized.

Although the power semiconductor device having the buried insulated gate shown in FIG. 1 is able to obtain the on-state voltage lower than that obtainable from a power semiconductor device having an insulated gate formed such that the gate electrode is formed on the surface of the device, the device of the foregoing type has a critical problem in that the gate has lower gate breakdown voltage as compared with the power semi-conductor device of the type having an insulated gate formed such that the gate electrode is formed on the surface of the device.

Although the power semiconductor device having the buried insulated gate shown in FIG. 1 is able to obtain the on-state voltage lower than that obtainable from a power semiconductor device having an insulated gate formed such that the gate electrode is formed on the surface of the device, an expected low on-state voltage obtained by simulation cannot be realized.

Assuming that the depth of the trench grooves in a portion projecting into the $n^-$ type base layer 3 is T ($\mu$m) and the length of the half cell is W ($\mu$m), the relationship among T, T·W and the on-state voltage is examined. Although the value of T·W with which the on-state voltage has the minimum value must not theoretically be changed even if the value of T is changed. However, the value of T·W is undesirably changed if T is changed. Thus, there arises a problem in that the design of the device cannot easily be performed.

BRIEF SUMMARY OF THE INVENTION

Accordingly, it is an object of the present invention to raise the gate breakdown voltage of an injection enhanced insulated gate bipolar transistor.

A related object of the present invention is to lower the on-state voltage of an injection enhanced insulated gate bipolar transistor.

A further object of the present invention is to make the value of T·W with which the value of the on-state voltage can be minimized to be invariable even if the value of T is changed.

To achieve the foregoing objects, according to one aspect of the present invention, there is provided a power semi-conductor device comprising a first conductivity type emitter layer; a second conductivity type base layer formed on the first conductivity type emitter layer and having high impedance; a first conductivity type base layer formed on the surface of the second conductivity type base layer; a plurality of second conductivity type emitter layers partially formed on the surface of the first conductivity type base layer; a gate electrode, through a gate insulation film, buried in a plurality grooves extending from the surface of the second conductivity type emitter layer to the second conductivity type base layer through the first conductivity type base layer; a first main electrode formed in the first conductivity type emitter layer; and a second main electrode formed in the second conductivity type emitter layer and the first conductivity type base layer, wherein average roughness of the surfaces of the second conductivity type emitter layer below the gate insulation film, the first conductivity type base layer and the second conductivity type base layer is 0.6 $\mu$m or smaller.

The power semiconductor device according to the first aspect of the present invention enables high gate breakdown voltage similar to that of a power semi-conductor device having an insulated gate structure in which a gate electrode is formed on the surface.

A power semiconductor device according to a second aspect of the present invention has a structure which is the same as that of the semiconductor apparatus according to the first aspect of the present invention except for the average roughness of the surfaces of the second conductivity type emitter layer below the gate insulation film, the first conductivity type base layer and the second conductivity type base layer being 0.3 nm or smaller.

The power semiconductor device according to the second aspect of the present invention enables substantially theoretical on-state voltage which is obtained by simulation to be realized. Moreover, the power semiconductor device according to the second aspect of the present invention is able to make the value of T·W with which the value of the on-state voltage can be minimized to be invariable even if the value of T is changed.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE INVENTION

A preferred embodiment of a power semiconductor device according to the present invention will now be described with reference to the accompanying drawings.

First Embodiment

Since a first embodiment has a schematic structure similar to that of the conventional device shown in FIG. 1, the similar portions are omitted from detailed description. The difference between the first embodiment and the conventional structure lies in that minute irregular portions existing on the silicon (the $n^+$ type emitter layer 5, the p type base layer 4 and the $n^-$ type base layer 3) on the side walls and bottom surface of the trench grooves below the gate oxide film 6 are eliminated. That is, the average roughness is made to be a value considerably smaller than a certain value. The average roughness is defined as follows:

$$\sqrt{\frac{1}{N}\sum_{i=1}^{N}\left(h_i - \frac{1}{N}\sum_{i=1}^{N}h_i\right)^2} \qquad (1)$$

where N is the number of measured points and $h_i$ is the height (the height from the reference surface) of the i-th measured point.

Figure 2:
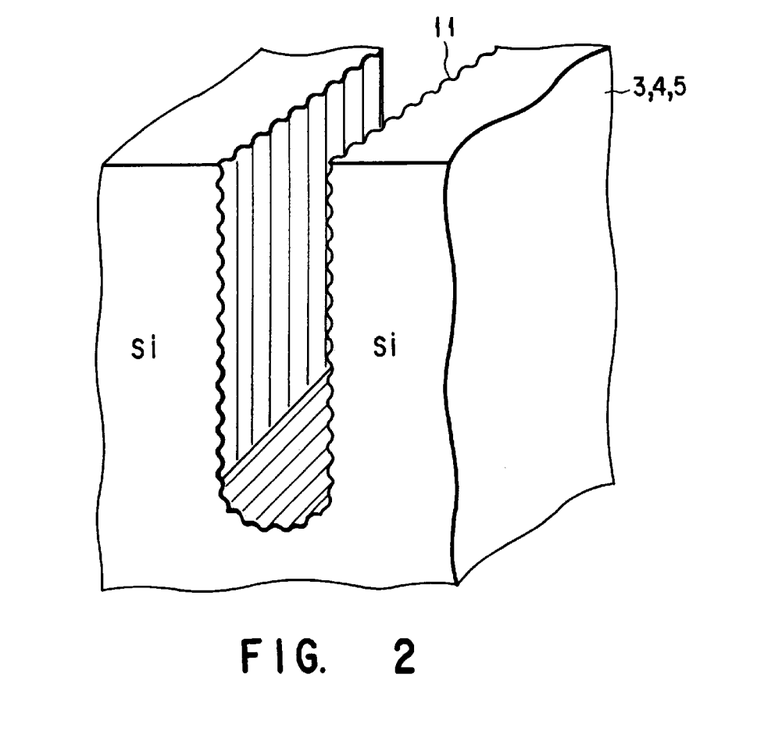
FIG. 2 is a diagram showing minute irregular portions existing on silicon in the side and bottom surfaces of trench grooves.

The reason why the average roughness is reduced will now be described. It can be considered that the gate breakdown voltage of the injection enhanced insulated gate bipolar transistor shown in FIG. 1 is lowered and a theoretical on-state voltage obtained by simulation cannot be obtained because of minute irregular portions 11 of the silicon existing on the side and bottom surfaces of the trench grooves as shown in FIG. 2. That is, the reason why the gate breakdown voltage is lowered is the irregular thicknesses of the gate oxide film 6 due to the irregular portions. As for the on-state voltage, the reason for this lies in that the mobility of electrons flowing in the channels formed on the side walls of the trench grooves is lowered and the efficiency to inject electrons from the n$^+$ type emitter layer 5 into the n$^-$ type base layer 3 therefore deteriorates.

To prove the above-mentioned idea, comparisons were performed for several samples having different values of the average roughness for the side and bottom surfaces of the trench grooves. As a result, the gate breakdown voltage was increased and the on-state voltage was lowered as the value of the average roughness was reduced.

The inventors of the present invention have manufactured seven samples respectively having different average roughness values of the side and bottom surfaces of the trench grooves below the gate oxide film 6 of the device shown in FIG. 1 to investigate the influence of the average roughness on the characteristics of the device.

Sample 1

An oxide film was formed on silicon wafer (having specific resistance of 450 Ω·cm and a thickness of 550 μm) on which a p$^+$ type emitter layer 1, an n type buffer layer 2, a p type base layer 4 and an n$^+$ type emitter layer 5 have been formed. An ordinary resist having the molecular quantity distribution ranging up to several digits was applied to the surface of the oxide film, followed by performing exposure during an optimum period of time so that a resist pattern was formed. The average roughness of the resist pattern on the side and bottom walls was 1.5 nm. Data required to obtain the average roughness was collected by an AFM (Atomic Force Microscopy) measurement.

Then, the resist pattern was used as an etching mask and the oxide film was subjected to the RIE (Reactive Ion Etching) process so that an oxide film pattern was formed. Though the optimum gas component is $CHF_3:SF_6=45:2$, herein the gas component of $CHF_3:SF_6=55:2$ was used. The average roughness of the oxide film pattern on the side and bottom walls was 2.3 nm.

Then, the resist pattern was peeled, and the oxide film pattern was used as an etching mask so that trench grooves were formed in the silicon wafer by the RIE process. The optimum gas component of $HBr:SiF_4:O_2=140:2:1.5$ is used in the RIE process. The average roughness of silicon on the side and bottom walls of the trench grooves was 7.7 nm.

Finally, a gate oxide film 6 having a thickness of 100 nm was formed in the trench grooves, and then a gate electrode 7 was buried. The average roughness of silicon on the side and bottom walls of the trench grooves below the gate oxide film 6 was 1.5 nm. The reason for this is that the silicon on the side and bottom walls of the trench grooves was flattened and smoothed when the gate oxide film 6 was formed.

The gate breakdown voltage of Sample 1 was 25V.

Figure 3:
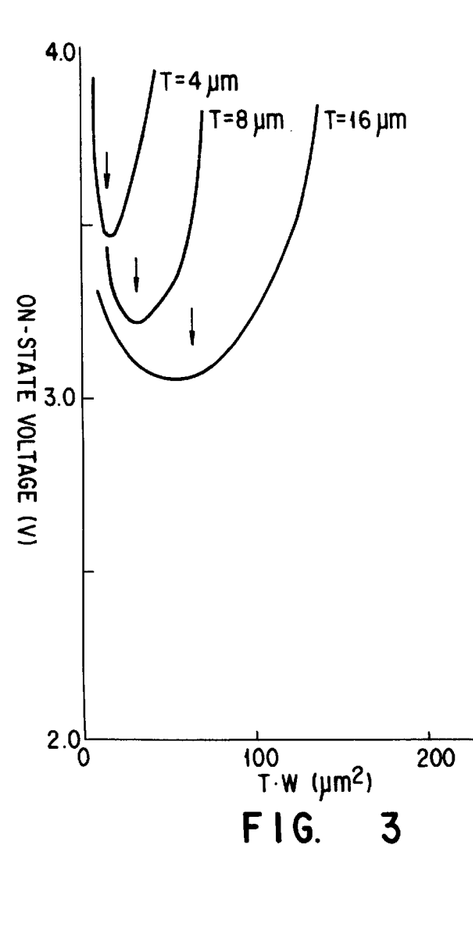
FIG. 3 is a graph showing the relationship among T, T·W and on-state voltage of Sample 1 containing silicon on the side and bottom surfaces of the trench grooves below the gate oxide film of the device having the structure shown in FIG. 1 and having the average roughness of 1.5 nm.

FIG. 3 is a graph showing the relationship among T, T·W and on-state voltage of Sample 1 in which silicon on the side and bottom surfaces of the trench grooves below the gate oxide film 6 of the device shown in FIG. 1 has the average roughness of 1.5 nm.

As can be understood from the graph, the lowest level of the on-state voltage was 3V or higher regardless of the value of T. Thus, the on-state voltage was not lowered significantly.

Moreover, the on-state voltage was minimized in portions near T·W=16 μm$^2$, T·W=32 μm$^2$ and T·W=64 μm$^2$ when values of T respectively were 4 μm, 8 μm and 16 μm. Thus, the value of T·W with which the on-state voltage can be minimized is varied depending upon the value of T.

Sample 2

The buried gate of Sample 2 was formed similarly to that of Sample 1 except for the RIE process to the oxide is performed under the optimum gas component of $CHF_3:SF_6=45:2$.

The average roughness of silicon on the side and bottom walls of the trench grooves of Sample 2 was 0.9 nm and the gate breakdown voltage was 37V.

Figure 4:
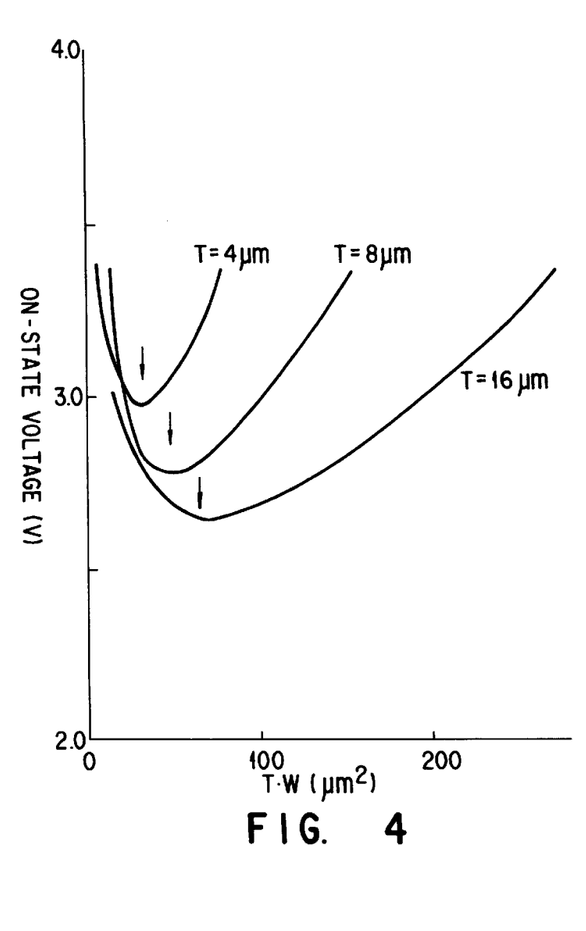
FIG. 4 is a graph showing the relationship among T, T·W and on-state voltage of Sample 2 containing silicon on the side and bottom surfaces of the trench grooves below the gate oxide film of the device having the structure shown in FIG. 1 and having the average roughness of 0.9 nm.

FIG. 4 is a graph showing the relationship among T, T·W and on-state voltage of Sample 2 in which silicon on the side and bottom surfaces of the trench grooves below the gate oxide film 6 of the device shown in FIG. 1 has the average roughness of 0.9 nm.

As can be understood from the graph, the lowest on-state voltage was lower than 3V. Thus, the overall on-state voltage was lowered as compared with Sample 1.

Moreover, the on-state voltage was minimized in portions near T·W=32 μm$^2$, T·W=48 μm$^2$ and T·W=64 μm$^2$ when values of T respectively were 4 μm, 8 μm and 16 μm. Thus, the value of T·W with which the on-state voltage could be minimized was varied depending upon the value of T. However, the dependency on T was lowered as compared with Sample 1.

Sample 3

A buried gate of Sample 3 was formed as follows:

An oxide film was formed on silicon wafer using a resist different from Samples 1 and 2 in which a molecular quantity distribution is within one digit, that is, has a narrow molecular quantity distribution. The exposure time is set to an optimum period of time. The oxide film is subjected to the RIE process under the optimum gas component of $CHF_3:SF_6=45:2$. The silicon wafer is subjected to the RIE process under a gas component of $HBr:SiF_4:O_2=140:2:0.5$.

The average roughness of silicon on the side and bottom walls of the trench grooves of Sample 3 was 0.6 nm. The gate breakdown voltage was 57V.

Figure 5:
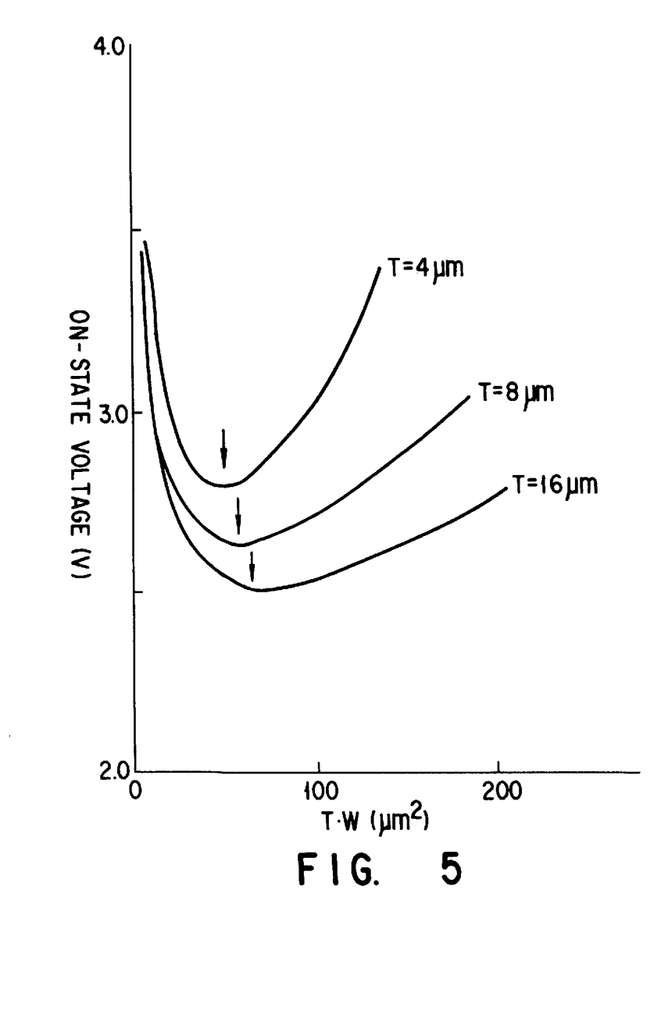
FIG. 5 is a graph showing the relationship among T, T·W and on-state voltage of Sample 3 containing silicon on the side and bottom surfaces of the trench grooves below the gate oxide film of the device having the structure shown in FIG. 1 and having the average roughness of 0.6 nm.

FIG. 5 is a graph showing the relationship among T, T·W and on-state voltage of Sample 3 in which silicon on the side and bottom surfaces of the trench grooves below the gate oxide film 6 of the device 1 has the average roughness of 0.6 nm.

As can be understood from the graph, the on-state voltage was generally lowered as compared with Samples 1 and 2.

Moreover, the on-state voltage was minimized in portions near T·W=50 μm$^2$, T·W=58 μm$^2$ and T·W=64 μm$^2$ when values of T respectively were 4 μm, 8 μm and 16 μm. Thus, the value of T·W with which the on-state voltage could be minimized was varied depending upon the value of T. However, the dependency on T was lowered as compared with Samples 1 and 2.

Sample 4

A buried gate of Sample 4 was formed as follows.

Similarly to Sample 3, a resist having a molecular quantity distribution within one digit, that is, having a narrow molecular quantity distribution was employed. However, the resist pattern is formed after development during a double of an optimum development time. The oxide film is subjected to the RIE process under the optimum gas component of $CHF_3:SF_6=45:2$. The silicon wafer is subjected to the RIE process under the optimum gas component of $HBr:SiF_4:O_2=140:2:1.5$.

The average roughness of silicon on the side and bottom walls of the trench grooves of Sample 4 was 0.4 nm and the gate breakdown voltage was 59V.

Figure 6:
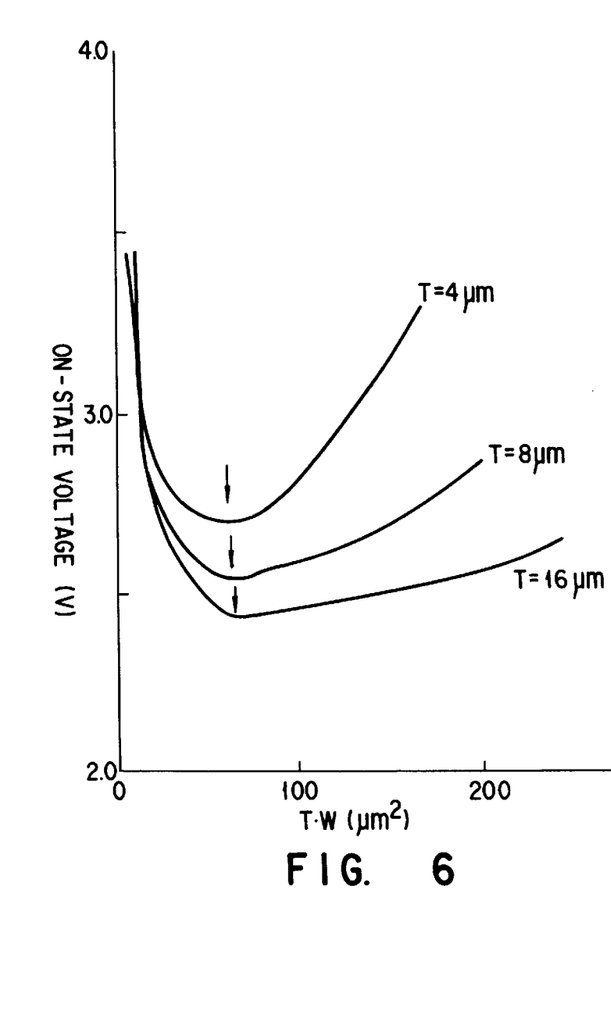
FIG. 6 is a graph showing the relationship among T, T·W and on-state voltage of Sample 4 containing silicon on the side and bottom surfaces of the trench grooves below the gate oxide film of the device having the structure shown in FIG. 1 and having the average roughness of 0.4 nm.

FIG. 6 is a graph showing the relationship among T, T·W and on-state voltage of Sample 4 in which silicon on the side and bottom surfaces of the trench grooves below the gate oxide film 6 of the device shown in FIG. 1 has the average roughness of 0.4 nm.

As can be understood from the graph, the on-state voltage was generally lowered as compared with Samples 1, 2 and 3.

Moreover, the on-state voltage was minimized in portions near T·W=60 $\mu m^2$, T·W=62 $\mu m^2$ and T·W=64 $\mu m^2$ when values of T respectively were 4 $\mu m$, 8 $\mu m$ and 16 $\mu m$. Thus, the value of T·W with which the on-state voltage could be minimized was varied depending upon the value of T. However, the dependency on T was lowered as compared with Samples 1, 2 and 3.

Sample 5

A buried gate was formed by a method similar to that of Sample 4 except for the resist was developed after exposure during an optimum exposure time.

The average roughness of silicon on the side and bottom walls of the trench grooves of Sample 5 was 0.3 nm and the gate breakdown voltage was 61V.

Figure 7:
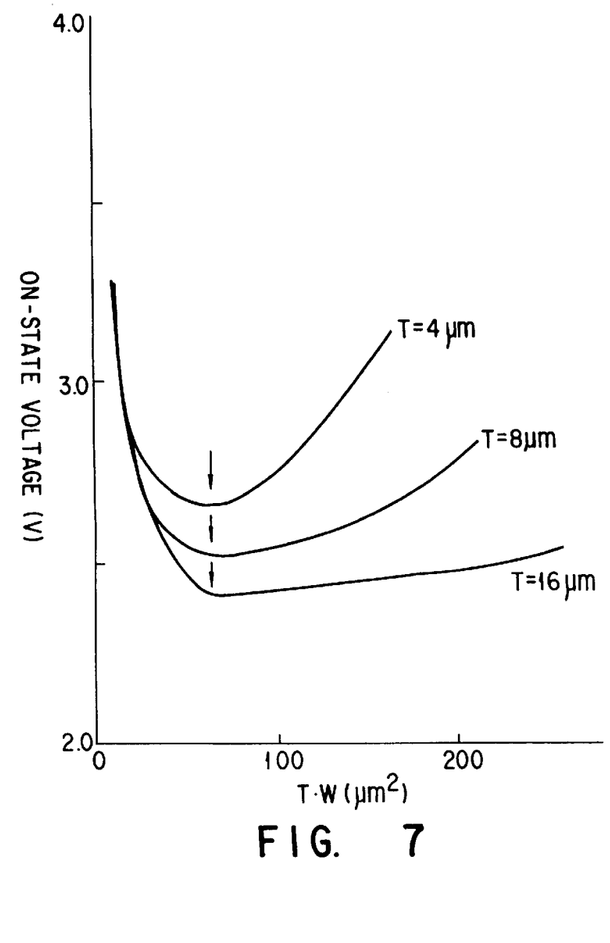
FIG. 7 is a graph showing the relationship among T, T·W and on-state voltage of Sample 5 containing silicon on the side and bottom surfaces of the trench grooves below the gate oxide film of the device having the structure shown in FIG. 1 and having the average roughness of 0.3 nm.

FIG. 7 is a graph showing the relationship among T, T·W and on-state voltage of Sample 5 in which silicon on the side and bottom surfaces of the trench grooves below the gate oxide film 6 of the device shown in FIG. 1 has the average roughness of 0.3 nm.

As can be understood from the graph, the on-state voltage was lowered as compared with Sample 4.

Moreover, the on-state voltage was minimized in a portion near T·W=64 $\mu m^2$ when values T were 4 $\mu m$, 8 $\mu m$ and 16 $\mu m$. Thus, the value of T·W with which the on-state voltage could be minimized was constant regardless of the value of T.

Sample 6

A buried gate was formed by a method similar to that employed to form the buried gate of Sample 5. The difference from Sample 5 lies in that the gate oxide film 6 was formed after the side and bottom surfaces of the trench grooves were positively smoothed and flattened by CDE (Chemical Dry Etching) process.

The average roughness of silicon on the side and bottom walls of the trench grooves of Sample 6 was 0.2 nm and the gate breakdown voltage was 62V.

Figure 8:
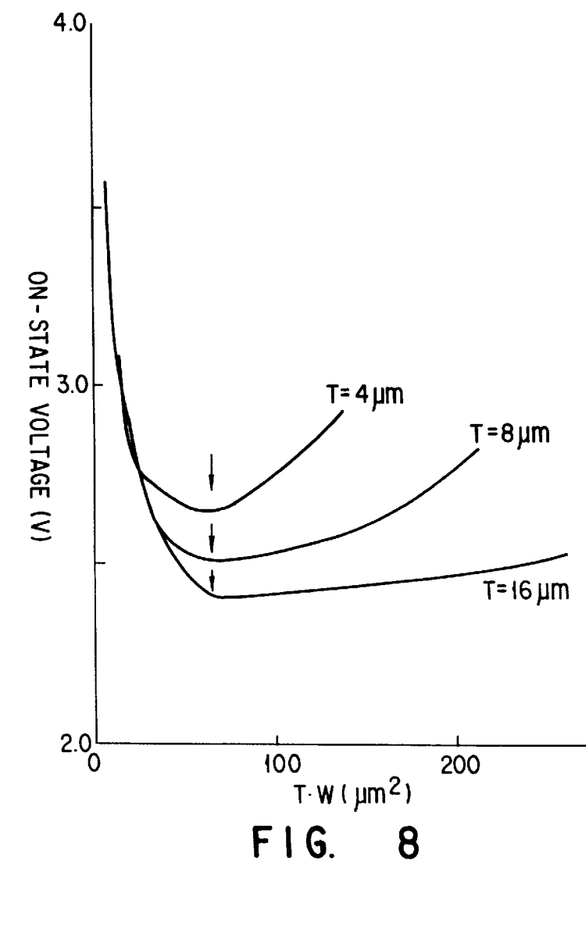
FIG. 8 is a graph showing the relationship among T, T·W and on-state voltage of Sample 6 containing silicon on the side and bottom surfaces of the trench grooves below the gate oxide film of the device having the structure shown in FIG. 1 and having the average roughness of 0.2 nm.

FIG. 8 is a graph showing the relationship among T, T·W and on-state voltage of Sample 6 in which silicon on the side and bottom surfaces of the trench grooves below the gate oxide film 6 of the device shown in FIG. 1 has the average roughness of 0.2 nm.

As can be understood from the graph, the on-state voltage was slightly lowered as compared with Sample 5.

Moreover, the on-state voltage was minimized in portions near T·W=64 $\mu m^2$ when values T were 4 $\mu m$, 8 $\mu m$ and 16 $\mu m$ similarly to Sample 5. Thus, the value of T·W with which the on-state voltage could be minimized was constant regardless of the value of T.

Sample 7

A buried gate was formed by a method similarly to that employed to form the buried gate of Sample 5. The difference from Sample 5 lies in that the side and bottom surfaces of the trench grooves were positively smoothed and flattened by sacrifice oxidation.

The average roughness of silicon on the side and bottom walls of the trench grooves of Sample 7 was 0.1 nm and the gate breakdown voltage was 62V.

Figure 9:
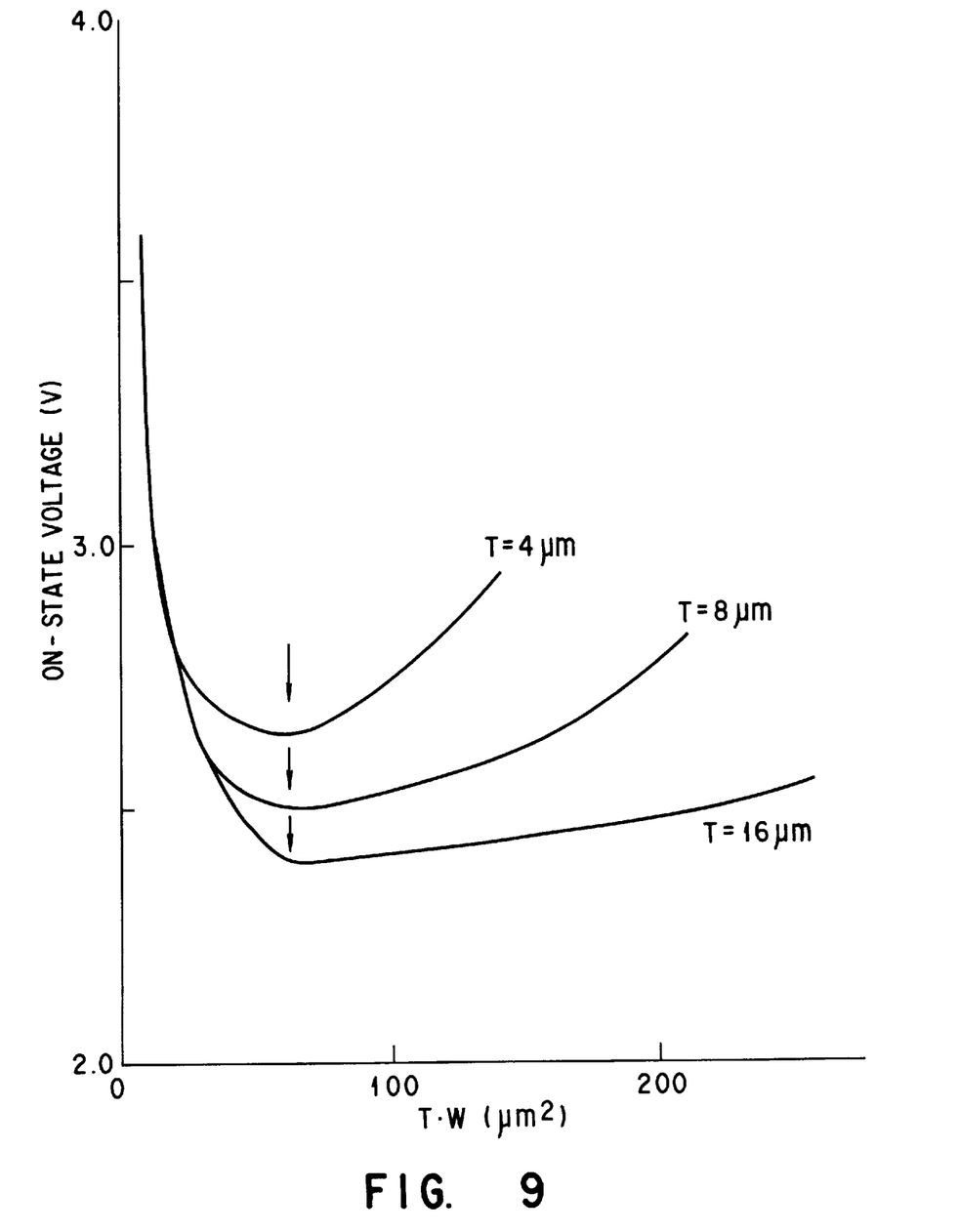
FIG. 9 is a graph showing the relationship among T, T·W and on-state voltage of Sample 7 containing silicon on the side and bottom surfaces of the trench grooves below the gate oxide film of the device having the structure shown in FIG. 1 and having the average roughness of 0.1 nm.

FIG. 9 is a graph showing the relationship among T, T·W and on-state voltage of Sample 7 in which silicon on the side and bottom surfaces of the trench grooves below the gate oxide film 6 of the device shown in FIG. 1 has the average roughness of 0.1 nm.

As can be understood from the graph, the on-state voltage was slightly lowered as compared with Sample 5.

Moreover, the on-state voltage was minimized in portions near T·W=64 $\mu m^2$ when values T were 4 $\mu m$, 8 $\mu m$ and 16 $\mu m$ similarly to Samples 5 and 6. Thus, the value of T·W with which the on-state voltage could be minimized was constant regardless of the value of T.

The results of measurement of Samples 1 to 7 were tabulated as follows:

TABLE 1

| Sample | 1 | 2 | 3 | 4 | 5 | 6 | 7 |
|---|---|---|---|---|---|---|---|
| Average Roughness (nm) | 1.5 | 0.9 | 0.6 | 0.4 | 0.3 | 0.2 | 0.1 |
| Minimum On-State Voltage (V) | 3.06 | 2.63 | 2.50 | 2.42 | 2.40 | 2.40 | 2.40 |
| Gate Breakdown Voltage (V) | 25 | 37 | 57 | 59 | 61 | 62 | 62 |

It is understood that if the average roughness of silicon on the side and bottom surfaces of the trench grooves below the gate oxide film 6 is 0.6 nm or smaller, then the gate breakdown voltage can sufficiently be raised (made to be similar to that of the insulated gate bipolar transistor having a gate electrode on the surface of the device).

Further, it is understood that if the value of the average roughness is made to be smaller, the on-state voltage approximates to a theoretical value which is obtained by simulation on the assumption that the mobility of electrons flowing in the channels of the injection enhanced insulated gate bipolar transistor having a buried gate electrode is the same as that in the insulated gate bipolar transistor having a gate electrode on the surface of the device. If the average roughness is 0.3 nm or smaller, the on-state voltage can be lowered sufficiently. Moreover, the value of T·W with which the on-state voltage is minimized is constant regardless of the value of T. If the value of T·W with which the on-state voltage can be minimized is made to be constant regardless of T, the device can easily be designed in such a manner that the value of the on-state voltage can be minimized.

Although the value of T·W with which the value of the on-state voltage can be minimized was equally 64 $\mu m^2$ in Samples 5 to 7, this value may change if the specific resistance and thickness of the wafer change because it depends on the specific resistance and thickness of the wafer.

As described above, according to this embodiment, the average roughness of the surface of the second conductivity type emitter layer, the first conductivity type base layer and the second conductivity type base layer below the gate insulation film was made to be 0.6 nm or smaller. Thus, an injection enhanced insulated gate bipolar transistor exhibiting gate breakdown voltage higher than that of a conventional device can be realized. Further, if the average roughness is made to be 0.3 nm or smaller, an injection enhanced insulated gate bipolar transistor can be realized which has the on-state voltage lower than that of the conventional structure, in which the value of T·W with which the value of the on-state voltage can be minimized is constant regardless of the value of T and which can easily be designed.

Other embodiments of the power semiconductor device according to the present invention will be described. The same portions as those of the first embodiment will be indicated in the same reference numerals and their detailed description will be omitted.

Second Embodiment

The first embodiment employs the method in which the average roughness is reduced to lower the on-state voltage to the theoretical value obtained by simulation. A second embodiment employs another approach to lower the on-state voltage.

A second reason why theoretical on-state voltage cannot be realized with the device shown in FIG. 1 may be based on the following fact. The shape of the trench grooves in the surface of the device is straight and the shape of the cathode electrode is therefore straight. Therefore, the distribution of carriers in the lengthwise direction of the trench grooves and that in a lateral direction perpendicular to the lengthwise direction are different from each other. As a result, two-dimensionally uniform carrier distribution cannot be realized.

Figure 10:
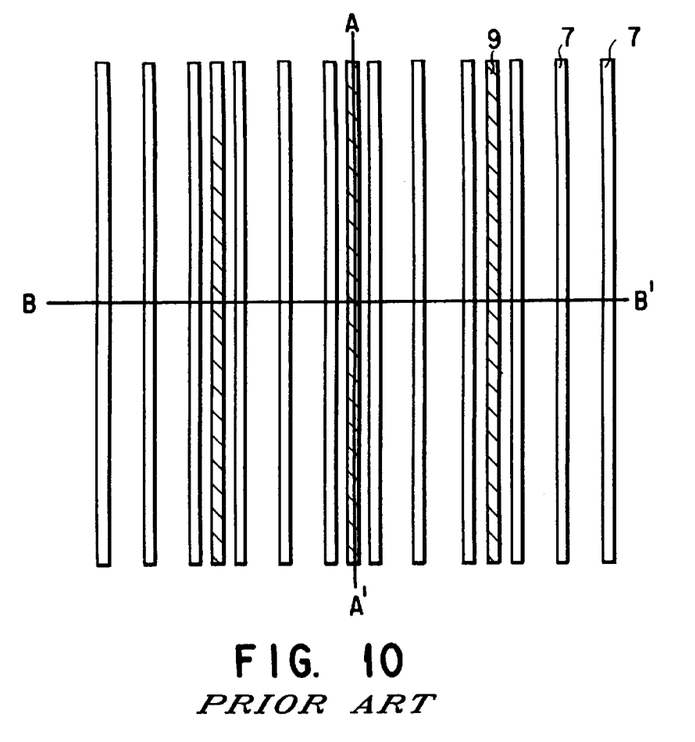
FIG. 10 is a plan view showing the configuration of the gate electrodes (the trench grooves) and the cathode electrodes of the device shown in FIG. 1.
Figure 11:
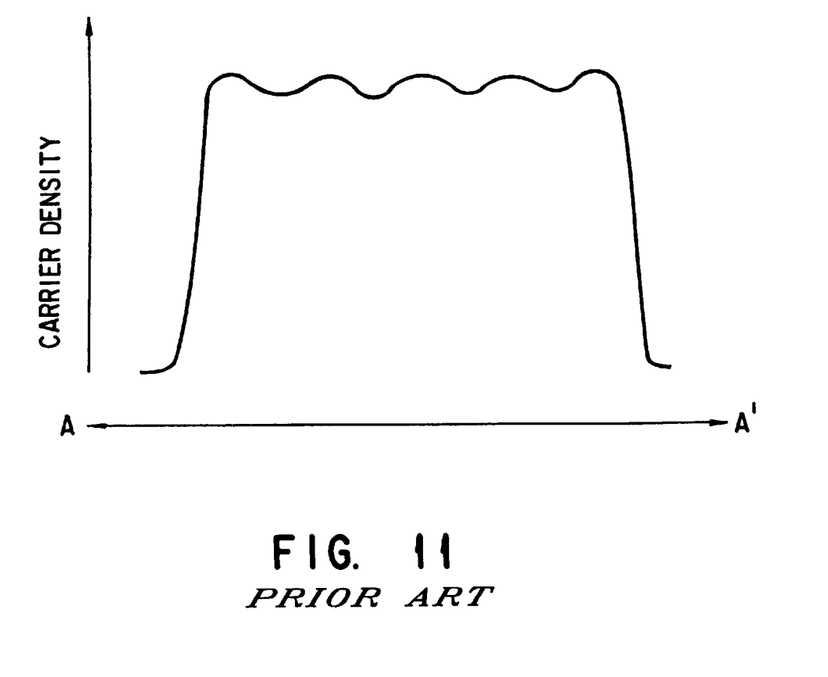
FIG. 11 is a graph showing distribution of carriers along line A–A' shown in FIG. 10.
Figure 12:
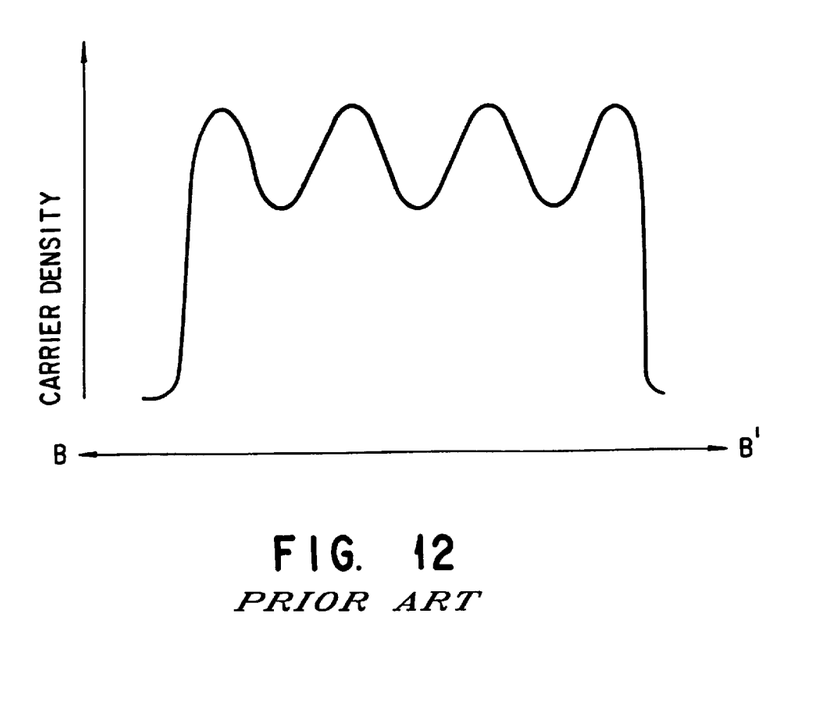
FIG. 12 is a graph showing distribution of carriers along line B–B' shown in FIG. 10.

FIG. 10 is a plan view showing the positions of trench grooves (gate electrodes 7) and cathode electrodes 9 on the surface of the injection enhanced insulated gate bipolar transistor shown in FIG. 1. The distribution of carriers in one direction A–A' (lengthwise direction of FIG. 10) of the trench grooves is relatively uniform as shown in FIG. 11. However, the distribution of carriers in the other direction B–B' (lateral direction of FIG. 10) perpendicular to the lengthwise direction of the trench grooves varies considerably depending upon the positions, as shown in FIG. 12. The above-mentioned fact that the carrier distribution in the lengthwise direction of the trench grooves differs from the carrier distribution in the lateral direction increases the on-state voltage.

Figure 13:
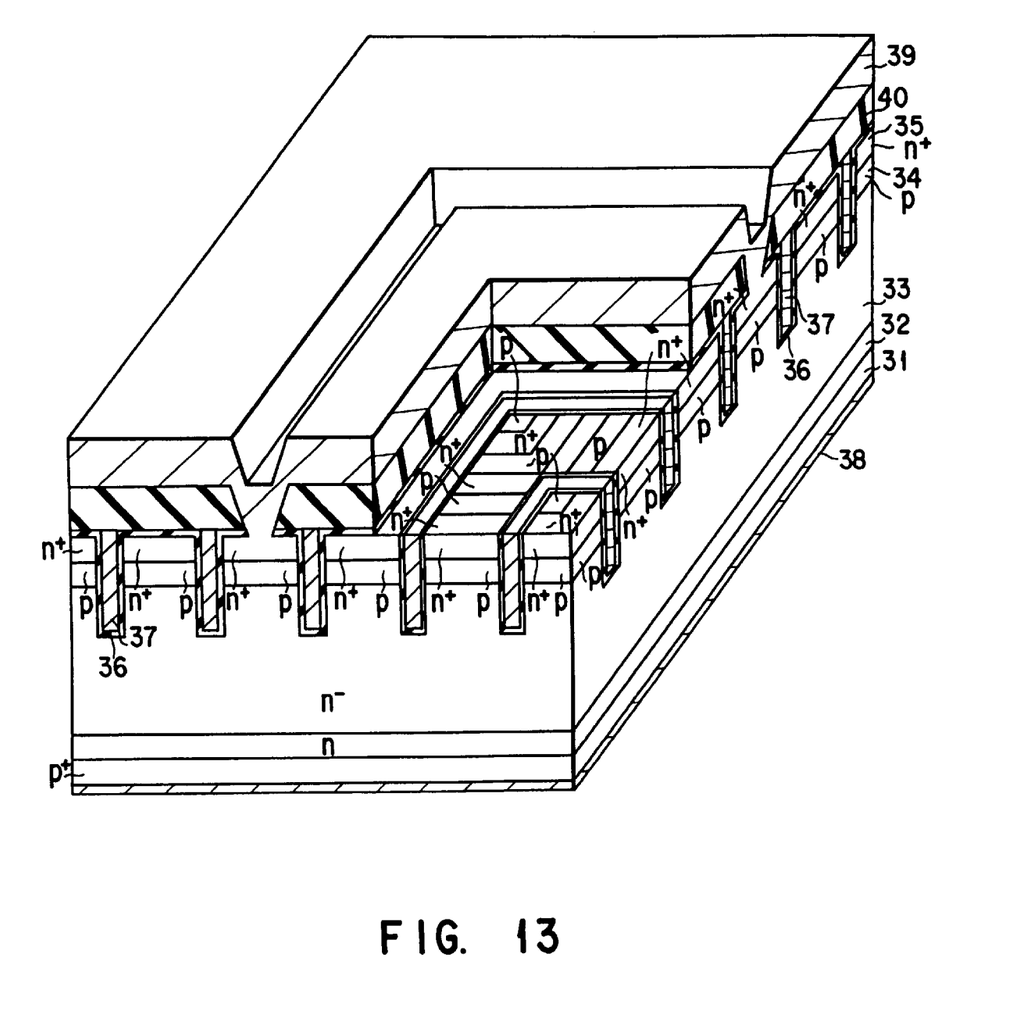
FIG. 13 is a perspective cross sectional view showing a second embodiment of the injection enhanced insulated gate bipolar transistor according to the present invention.

The second embodiment is structured as shown in FIG. 13.

An n type buffer layer 32, a high impedance n⁻ type base layer 33 and a p type base layer 34 are formed on a high concentration p⁺ type emitter layer 31.

Figure 14:
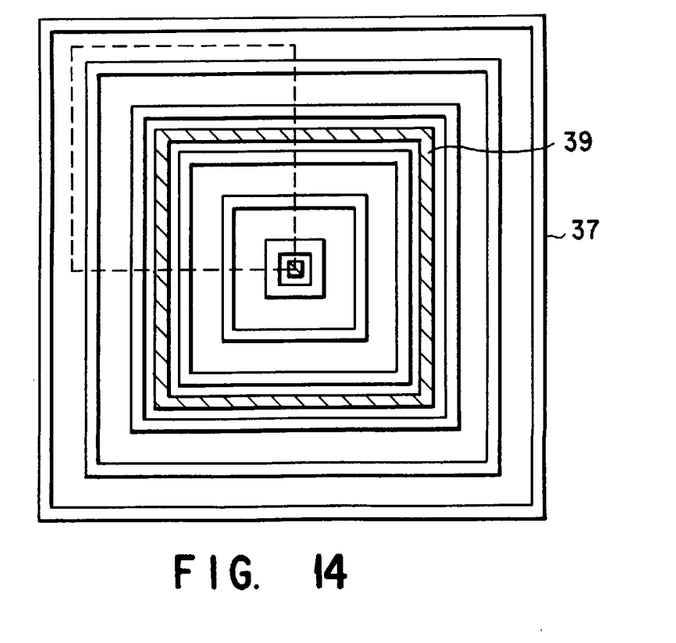
FIG. 14 is a plan view showing configuration of the gate electrodes (the trench grooves) and the cathode electrodes.

A high concentration n⁺ type emitter layer 35 is partially formed in the surface region of the p type base layer 34. The elongated emitter layer 35 is formed to be four-times symmetry around the center. A plurality of trench grooves are formed on the surface of the device on which the n⁺ type emitter layer 35 is formed to be perpendicular to the n⁺ type emitter layer 35. The grooves are extended from the n⁺ type emitter layer 35 to the n⁻ type base layer 33 through the p type base layer 34. That is, the trench grooves (the gate oxide films 37) are, as shown in FIG. 14, formed into a plurality of concentric squares. FIG. 14 is a plan view showing the configuration of the trench grooves (gate electrodes 37) and the cathode electrode 39 of the injection enhanced insulated gate bipolar transistor shown in FIG. 13. Gate electrodes 37 are buried in the trench grooves through the gate oxide film 36.

An anode electrode 38 is formed on the surface of the p⁺ type emitter layer 31 opposite to the n type buffer layer 32. The cathode electrode 39 is formed on the surfaces of the p type base layer 34 and the n⁺ type emitter layer 35 through an insulation film 40. Also the cathode electrodes 39 are, as shown in FIG. 14, formed into a plurality of concentric squares.

According to the second embodiment, since the carrier distribution in the surface of the device is four-times symmetry around the center, the carrier distributions in the lengthwise direction of the trench grooves and the lateral direction are the same. Therefore, two-dimensionally uniform carrier distribution can be obtained and thus the on-state voltage can theoretically be lowered. Note that the concentric shape of the gate oxide film 37 may be circular or hexagonal.

Third Embodiment

A third embodiment employs still another approach to lower the on-state voltage.

Figure 15:
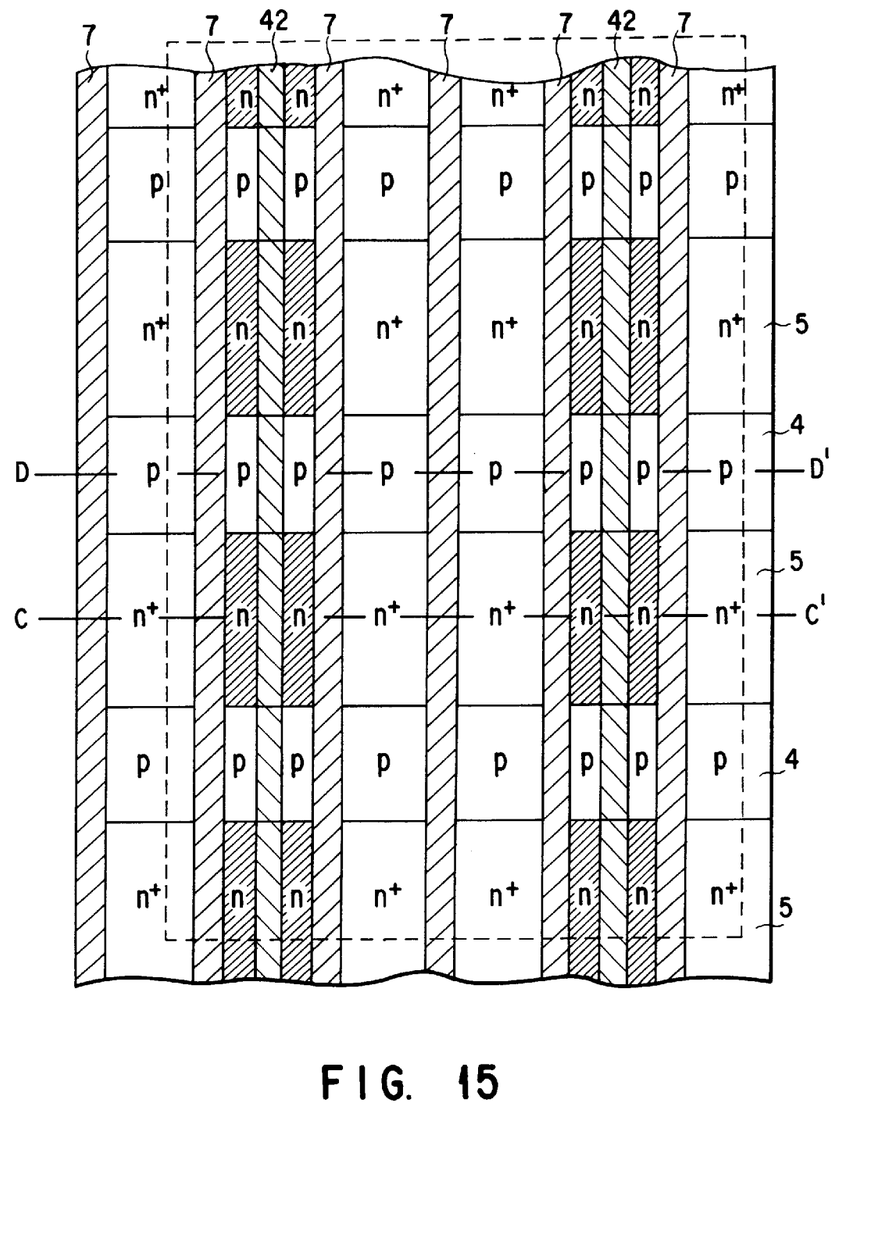
FIG. 15 is a plan view showing the relationship of positions of the first conductivity type base layer and the second conductivity type emitter layer of the device shown in FIG. 1.
Figure 16:
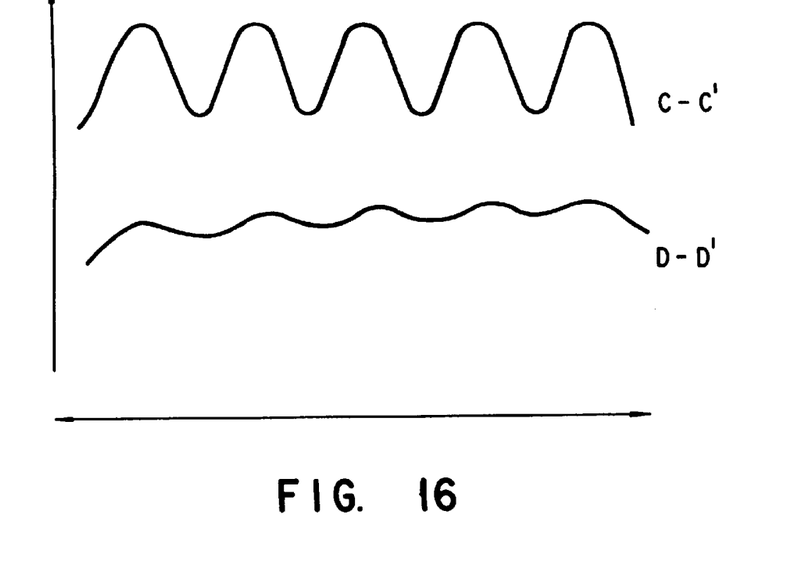
FIG. 16 is a graph showing distribution of carriers along lines C–C' and D–D' shown in FIG. 15.

A second reason why theoretical on-state voltage cannot be realized with the device shown in FIG. 1 may be based on the following fact. As shown in FIG. 15, the n⁺ type emitter layers 5 and the p type base layers 4 respectively form the straight lines along one direction perpendicular to the grooves (i.e., lateral direction in FIG. 15) on the surface of the device. Therefore, the distribution of carriers in the lateral direction perpendicular to the trench grooves is different depending upon the positions at which the line transverses the trench grooves. Distributions of carriers along lateral lines C–C' and D–D' perpendicular to the lengthwise direction of the grooves are shown in FIG. 16. The concentration of carriers is high along the line C–C' traversing the n⁺ type emitter layer 5 from which electrons can be implanted and varies depending upon the positions. However, the carrier concentration is low along the line D–D' traversing the p type base layer 4 from which electrons cannot be implanted and does not vary depending upon the positions. As described above, the difference in the carrier concentration is the reason why the on-state voltage being increased.

Figure 17:
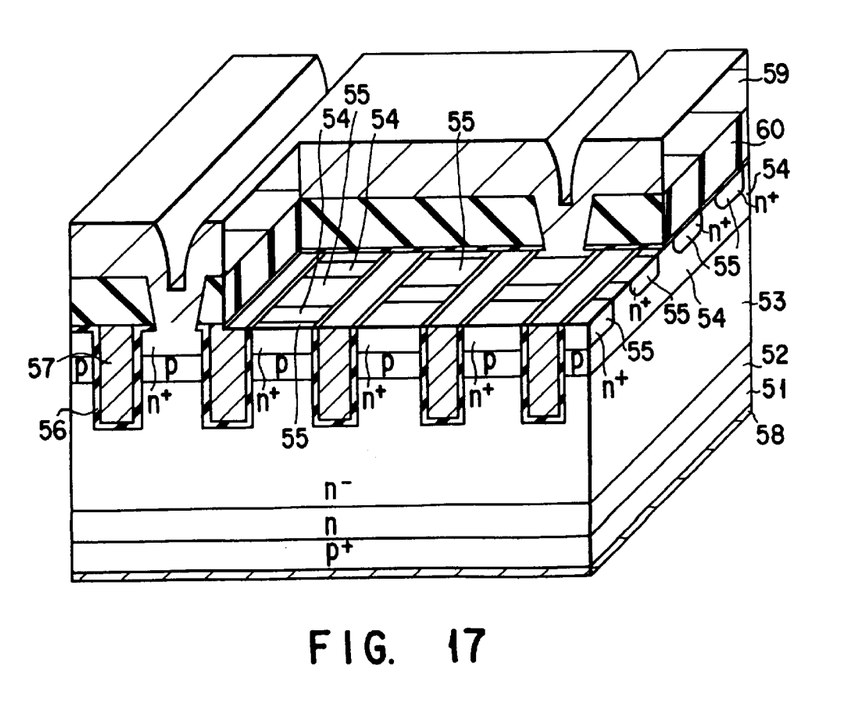
FIG. 17 is a perspective cross sectional view showing a third embodiment of the injection enhanced insulated gate bipolar transistor according to the present invention.

The third embodiment is structured as shown in FIG. 17.

An n type buffer layer 52, a high impedance n⁻ type base layer 53 and a p type base layer 54 are sequentially stacked on a high concentration p⁺ type emitter layer 51.

Figure 18:
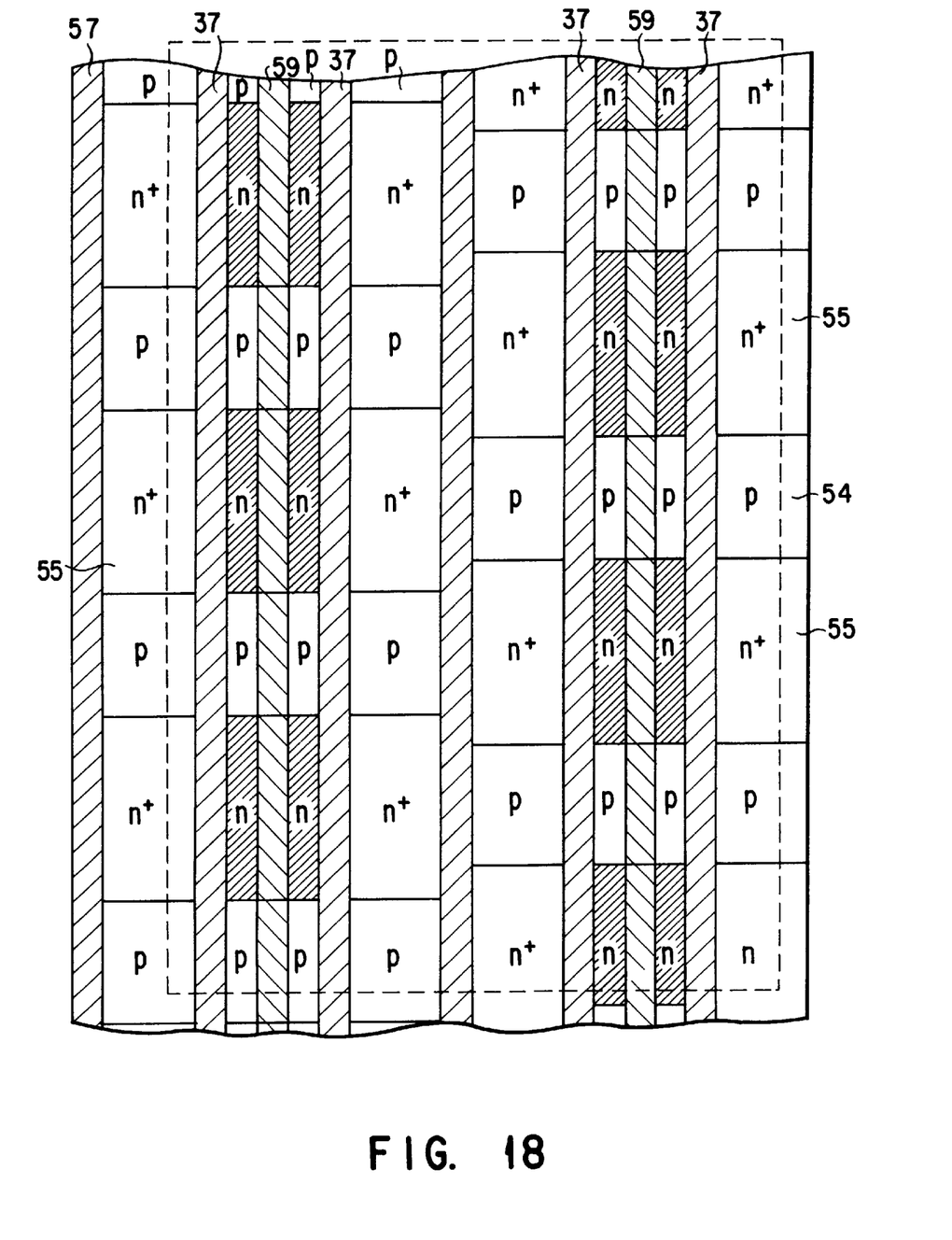
FIG. 18 is a plan view showing the relationship of positions of the first conductivity type base layer and the second conductivity type emitter layer according to the third embodiment.

A high concentration n⁺ type emitter layer 55 is partially formed on the surface of the p type base layer 54. A plurality of elongated n⁺ type emitter layers 55 are formed to be extended in one direction (the lateral direction in FIG. 17), similar to the first embodiment. However, the third embodiment is different from the first embodiment in that the n⁺ type emitter layers 55 are not aligned in a straight line. The n⁺type emitter layers 55 are in the form of zigzag lines, as shown in FIG. 18. That is, when one lateral line in one cell (a portion surrounding by a dashed line shown in FIG. 18) is considered, the p type base layer 54 (or the n⁺ type emitter layer 55) is disposed in the right-hand portion and the n⁺ type emitter layer 55 (or the p type base layer 54) is disposed on the left-hand portion.

The other arrangements are the same as those shown in FIG. 1. That is, a plurality of trench grooves extending perpendicular to the n⁺ type emitter layer 55 and allowed to reach the n⁻ type base layer 53 from the n⁺ type emitter layer 55 through the p type base layer 54 is formed on the surface of the device on which the n⁺ type emitter layer 55 is formed. Gate electrodes 57 are buried in the trench grooves through gate oxide films 56. A cathode electrode 59 is, through an insulation film 60, formed on the surfaces of the p type base layer 54 and the n⁺ type emitter layer 55. The cathode electrode 59 is connected to the n⁺ type emitter layer 55 and the p type base layer 54 through a through hole formed in the insulation film 60.

An anode electrode 58 is formed on the overall surface of the p⁺ type emitter layer 51 opposite to the n type buffer layer 52.

As described above, according to the third embodiment, the distributions of carriers in a direction perpendicular to the trench grooves are the same irrespective of the position of the trench grooves since any lateral line perpendicular to the trench grooves traverses the n⁺ type emitter layer 55. Therefore, the distribution of carriers is free from irregularity and thus the on-state voltage can to a theoretical value be lowered.

Fourth Embodiment

A method of manufacturing an injection enhanced insulated gate bipolar transistor according to a fourth embodiment will now be described.

Figure 19:
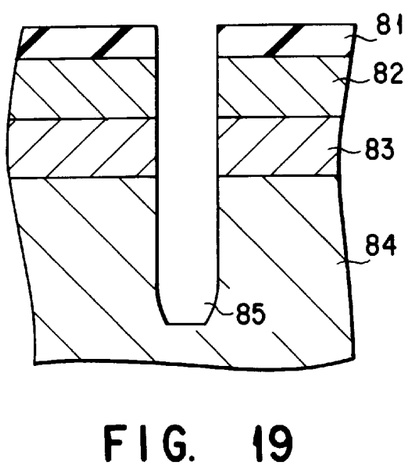
FIG. 19 is a cross sectional view of a buried insulated gate before a conventional chemical dry etching process.
Figure 20:
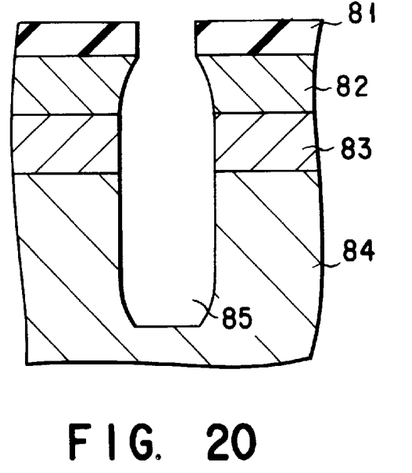
FIG. 20 is a cross sectional view of a buried insulated gate after the conventional chemical dry etching process.

As described above, it is effective to increase the gate breakdown voltage and to lower the on-state voltage that the side and bottom walls of the trench grooves are flattened and smoothed. It might therefore be preferable to perform chemical dry etching after the trench has been formed. An oxide film as a mask is deposited on the surface of the device for the chemical dry etching process. Since silicon adjacent to the boundary of the oxide film and the semiconductor layer cannot easily be etched due to the influence of the oxide film when the chemical dry etching is performed, the amount of etched portion is small as compared with an intermediate portion in the direction of the depth of the trench. As a result, the trench shape is undesirably formed into a bowing shape. The bowing shape of the trench causes crystal fault to occur and the characteristics of the device deteriorate excessively. FIG. 19 is a cross sectional view of a trench groove before a conventional chemical dry etching process and FIG. 20 is a cross sectional view of a trench groove after the conventional chemical dry etching process. In these figures, reference numerals 81, 82, 83, 84 and 85 respectively represents an oxide film, $n^+$ type emitter layer, P type base layer, $n^-$ type base layer and trench groove. N type buffer layer and $p^+$ emitter layer which should be provided below the $n^-$ type base layer 84 are omitted in these figures.

Figure 21:
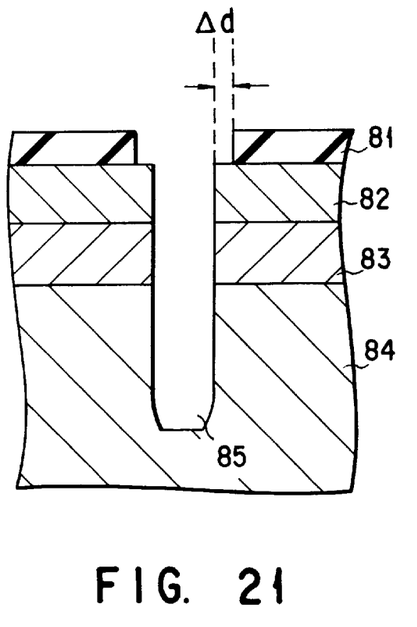
FIG. 21 is a cross sectional view of a buried insulated gate before a chemical dry etching process according to a fourth embodiment of the present invention.
Figure 22:
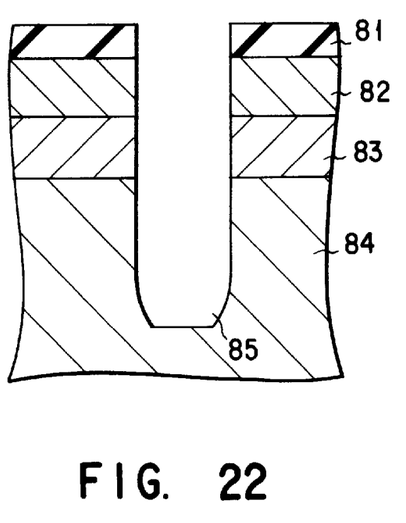
FIG. 22 is a cross sectional view of a buried insulated gate after the chemical dry etching process according to the fourth embodiment.

To prevent the shape of the trench grooves being formed into the blowing shape, the fourth embodiment employs wet etching before chemical dry etching to rearwards shift the edge of the oxide film to be positioned 200 nm or greater from the edge of the trench, as shown in FIG. 21. As a result, any influence of the oxide film can be eliminated when the chemical dry etching is performed. The overall portion along the depth direction of the trench can uniformly be etched, thus causing a fine trench shape to be obtained as shown in FIG. 22. If the amount of rearward shift $\Delta d$ is 200 nm or smaller, the chemical dry etching causes bowing shape to be generated. If the amount $\Delta d$ is 200 nm or greater, the bowing shape cannot be formed.

FIG. 21 is a cross sectional view of a trench groove before a chemical dry etching process according to the fourth embodiment and FIG. 22 is a cross sectional view of a trench groove after the chemical dry etching process according to the fourth embodiment.

As described above, according to the present invention, the average roughness of the surfaces of the second conductivity type emitter layer, the first conductivity type base layer and the second conductivity type base layer below the gate insulation film is made to be 0.6 nm or smaller. Therefore, there is provided an injection enhanced insulated gate bipolar transistor exhibiting the gate breakdown voltage higher than that of the conventional device.

Further, according to the present invention, the average roughness of the surfaces of the second conductivity type emitter layer, the first conductivity type base layer and the second conductivity type base layer below the gate insulation film is made to be 0.3 nm or smaller. Therefore, there is provided an injection enhanced insulated gate bipolar transistor which exhibits the on-state voltage lower than that of the conventional device and in which the value of T·W with which the value of the on-state voltage can be minimized is not changed even if the value of T is changed.

Moreover, the layout of the trench grooves is not formed into a simple straight line but is formed into a concentric shape so that the distribution of carriers on the surface of the device is made to be four-times symmetry and thus a two-dimensionally uniform distribution of carriers is obtained. Thus, the on-state voltage can be lowered to a theoretical value.

Since the $n^+$ type emitter layer is disposed along any lateral line perpendicular to the trench grooves, the distribution of carriers in the lateral direction does not change depending upon the position. Thus, the on-state voltage can be lowered to a theoretical value.

The edge of the oxide film on the device is shifted rearwards by 200 nm or greater from the edge of the trench by wet etching before chemical dry etching for flattening and smoothing the side surfaces of the trench grooves is performed. Thus, the bowing shape of the trench grooves cannot be formed and therefore a shape of the trench grooves can be straighten and crystal fault does not occur during the following process.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, several embodiments can be combined with each other.

What is claimed is:

1. A power semiconductor device comprising:

a first conductivity type emitter layer;

a second conductivity type base layer formed on said first conductivity type emitter layer and having high impedance;

a first conductivity type base layer formed on a surface region of said second conductivity type base layer;

plural second conductivity type emitter layers partially formed on a surface region of said first conductivity type base layer;

gate electrodes, through a gate insulation film, buried in plural grooves, the plural grooves having a depth to reach from the surface region of said second conductivity type emitter layers to said second conductivity type base layer through said first conductivity type base layer;

a first main electrode provided at said first conductivity type emitter layer; and a second main electrode provided at said second conductivity type emitter layers and said first conductivity type base layer, wherein said plural grooves are formed in parallel to be extended in a first direction, said plural second conductivity type emitter layers are formed on the surface region of said first conductivity type base layer such that a first region extended in the first direction in which the second conductivity type emitter layer and first conductivity type base layer are alternately arranged along the first direction and a second region extended in the first direction in which the second conductivity type emitter layer and first conductivity type base layer are alternately arranged along the first direction are connected to each other such that the second conductivity type emitter layer in the first region faces the first conductivity type base layer in the second region and the second conductivity type emitter layer in the second region faces the first conductivity type base layer in the first region.

2. A device according to claim 1, further comprising a second conductivity type buffer layer provided between said first conductivity type emitter layer and said second conductivity type base layer.

3. A device according co claim 1, wherein an average roughness of the surfaces of maid second conductivity type emitter layer, said first conductivity type base layer and said second conductivity typo base layer below said gate insulation film is 0.6 nm or smaller.

4. A device according to claim 3, wherein the average roughness is 0.3 mm or smaller.

5. A device according to claim 3, wherein the average roughness is defined as follows:

$$\sqrt{\frac{1}{N}\sum_{i=1}^{N}\left(h_i - \frac{1}{N}\sum_{i=l}^{N}h_i\right)^2}$$

where N is the number of measured points and $h_i$ is the height (the height from the reference surface) of the i-th measured point.

6. A power semiconductor device comprising:
a first conductivity type emitter layer;
a second conductivity type base layer formed on said first conductivity type emitter layer and having high impedance;
a first conductivity type base layer formed on a surface region of said second conductivity type base layer;
plural second conductivity type emitter layers partially formed on a surface region of said first conductivity type base layer;
gate electrodes, through a gate insulation film, buried in plural grooves, the plural grooves having a depth to reach from the surface region of said second conductivity type emitter layers to said second conductivity type base layer through said first conductivity type base layer;
a first main electrode provided at said first conductivity type emitter layer;
a second main electrode provided at said second conductivity type emitter layers and said first conductivity type base layer; and
plural cathode electrodes arranged in parallel with said plural grooves and connected to said second conductivity type emitter layers,
wherein said plural grooves are formed in parallel to be extended in a first direction, said plural second conductivity type emitter layers are formed on the surface region of said first conductivity type base layer such that a first region extended in the first direction in which the second conductivity type emitter layer and first conductivity type base layer are alternately arranged along the first direction and a second region extended in the first direction in which the second conductivity type emitter layer and first conductivity type base layer are alternately arranged along the first direction are connected to each other such that the second conductivity type emitter layer in the first region faces the first conductivity type base layer in the second region and the second conductivity type emitter layer in the second region faces the first conductivity type base layer in the first region, each of the first and second regions comprises subregions sandwiched between two grooves, the subregions comprising a first subregion having the cathode electrode and a second subregion having no cathode electrode.

7. A device according to claim 6, wherein subregions adjacent to the groove located between the first and second regions are the second subregions.

8. A device according to claim 6, wherein an average roughness of the surfaces of maid second conductivity type emitter layer, said first conductivity type base layer and said second conductivity typo base layer below said gate insulation film is 0.6 mn or smaller.

9. A device according to claim 8, wherein the average roughness is 0.3 nm or smaller.

10. A device according to claim 8, wherein the average roughness is defined as follows:

$$\sqrt{\frac{1}{N}\sum_{i=1}^{N}\left(h_i - \frac{1}{N}\sum_{i=l}^{N}h_i\right)^2}$$

where N is the number of measured points and $h_i$ is the height (the height from the reference surface) of the i-th measured point.

11. A device according to claim 6, further comprising a second conductivity type buffer layer provided between said first conductivity type emitter layer and said second conductivity type base layer.

* * * * *